United States Patent
Tsai

(10) Patent No.: US 10,153,104 B1
(45) Date of Patent: Dec. 11, 2018

(54) KEYBOARD STRUCTURE WITH ELECTROSTATIC DISCHARGE PROTECTION

(71) Applicant: Primax Electronics Ltd., Taipei (TW)

(72) Inventor: Lei-Lung Tsai, Taipei (TW)

(73) Assignee: PRIMAX ELECTRONICS LTD, Taipei (TW)

( * ) Notice: Subject to any disclaimer, the term of this patent is extended or adjusted under 35 U.S.C. 154(b) by 0 days.

(21) Appl. No.: 15/835,023

(22) Filed: Dec. 7, 2017

(30) Foreign Application Priority Data

Aug. 11, 2017 (TW) .............................. 106127328 A

(51) Int. Cl.
*H05K 1/02* (2006.01)
*H01H 13/705* (2006.01)
*H01H 13/7057* (2006.01)
*H01H 13/703* (2006.01)
*H05K 9/00* (2006.01)

(52) U.S. Cl.
CPC ........ *H01H 13/705* (2013.01); *H01H 13/703* (2013.01); *H01H 13/7057* (2013.01); *H05K 1/0259* (2013.01); *H05K 9/0067* (2013.01); *H01H 2239/008* (2013.01)

(58) Field of Classification Search
CPC .......... H01H 13/702–13/705-2239/008; H05K 1/0259–9/0067
USPC .................................................. 361/212, 622
See application file for complete search history.

(56) References Cited

U.S. PATENT DOCUMENTS

| | | | | |
|---|---|---|---|---|
| 6,043,989 A * | 3/2000 | Hayakawa | ........... | H05K 1/0215 361/220 |
| 6,323,445 B1 | 11/2001 | Yee | | |
| 7,227,734 B2 * | 6/2007 | Chu | ........ | H01H 13/70 361/212 |
| 7,612,976 B2 * | 11/2009 | Kamath | ................. | H01C 1/146 361/127 |

FOREIGN PATENT DOCUMENTS

TW          I578350 B      4/2017

* cited by examiner

*Primary Examiner* — Vanessa Girardi
(74) *Attorney, Agent, or Firm* — Muncy, Geissler, Olds & Lowe, P.C.

(57) ABSTRACT

The present invention provides a key structure with electrostatic discharge protection, including a key cap; a metal support panel; a support element, connecting the key cap and the metal support panel and capable of guiding the key cap to move up and down relative to the metal support panel; and a membrane circuit board, disposed on the metal support panel. The membrane circuit board includes: a first membrane layer, having a first surface and a second surface; a second membrane layer, having a third surface and a fourth surface; and an electrostatic protection structure, including: a first conductive layer, formed on a first surface of the first membrane layer; a second conductive layer, formed between the second surface of the first membrane layer and the third surface of the second membrane layer; and a third conductive layer, formed on the fourth surface of the second membrane layer.

16 Claims, 3 Drawing Sheets

KEYBOARD STRUCTURE WITH ELECTROSTATIC DISCHARGE PROTECTION

FIELD OF THE INVENTION

The present invention relates to a structure of an input device, and in particular, to a key and an electrostatic protection structure.

BACKGROUND OF THE INVENTION

In the modern society, the use of electronic products has become an indispensable part of the life, and necessities such as eating, clothing, living, traveling, teaching, and entertainment are correlated to electronic products. Generally, a consumption type product is configured with one or a plurality of keys. To improve usability of a key, one or a plurality of backlight units is configured on a circuit board of the key, so that a user may use the electronic product in relatively poor light source environment, or a prompt of the key may be provided for the user by means of a backlight unit.

However, in a process of manufacturing or using an electronic product, static electricity may be gradually accumulated in the electronic product. Once an electrostatic discharge (ESD) effect appears, a backlight unit or other electronic elements disposed on the circuit board may be damaged, to further influence the functions of the circuit, so that the electronic product cannot operate normally.

To prevent electrostatic discharge from damaging a backlight unit or other electronic elements disposed on a circuit board, an existing technical document, for example, the U.S. Pat. No. 6,323,445B1, provides a membrane switch structure with electrostatic discharge protection. The membrane switch structure includes three layers of insulation material. The ESD protection circuit pattern may at least copy the whole or a part of the conductive circuit pattern. The Taiwan patent no. TWI578350 provides a key and a keyboard using the same with electrostatic discharge protection. The circuit board includes: an upper membrane layer, a lower membrane layer, a spacer layer, a first conductive layer, and a second conductive layer. The first conductive layer is located between the lower membrane layer and the spacer layer; and the second conductive layer is located between the upper membrane layer and the spacer layer. In addition, the first conductive layer is electrically connected to the second conductive layer through a wire, and the second conductive layer is in contact with the grounding arm disposed on the baseboard, so as to conduct the static current that hits the first conductive layer to ground. However, in the existing technology, the electrostatic discharge protection circuit pattern is mostly disposed in an area overlapped with the spacer layer. Such the configuration may increase the thickness of the membrane circuit board, and in another aspect may influence the configuration of the key switch circuit. Moreover, additionally configuring a grounding arm may probably increase the complexity of manufacturing a key structure, resulting in reduction of the efficiency and yield of electronic product manufacturing.

Therefore, how to provide a key structure capable of rapidly and effectively conducting static electricity to ground and meanwhile reducing the complexity of manufacturing a key structure and the thickness of the circuit board is a technical matter to be resolved in the present invention.

SUMMARY OF THE INVENTION

A main objective of the present invention lies in providing a key structure with electrostatic discharge protection capable of rapidly and effectively conducting static electricity to ground, and meanwhile reducing the complexity of manufacturing the key structure with electrostatic discharge protection and the thickness of the membrane circuit board.

To achieve the foregoing objective, the present invention provides a key structure with electrostatic discharge protection, including:

a key cap;

a metal support panel;

a support element, connected to the metal support panel of the key cap and capable of guiding the key cap to move up and down relative to the metal support panel; and a membrane circuit board, disposed on the metal support panel, where the membrane circuit board includes:

a first membrane layer, having a first surface and a second surface;

a second membrane layer, having a third surface and a fourth surface; and an electrostatic protection structure, including:

a first conductive layer, formed on a first surface of the first membrane layer;

a second conductive layer, formed between the second surface of the first membrane layer and the third surface of the second membrane layer; and a third conductive layer, formed on a fourth surface of the second membrane layer.

In the preferable embodiment, the membrane circuit board further includes a spacer layer, the spacer layer is disposed between the first membrane layer and the second membrane layer, and an area of the spacer layer is smaller than that of the first membrane layer and the second membrane layer.

In the preferable embodiment, the membrane circuit board includes at least one opening, and the at least one opening passes through the first membrane layer and the second membrane layer.

In the preferable embodiment, the electrostatic protection structure is disposed at an inner edge of the at least one opening.

In the preferable embodiment, the electrostatic protection structure surrounds around the inner edge of the at least one opening.

In the preferable embodiment, thicknesses of the first conductive layer, the second conductive layer, and the third conductive layer are in a range of 7 μm to 12 μm.

In the preferable embodiment, materials of the first membrane layer and the second membrane layer both are polyethylene terephthalate.

In the preferable embodiment, materials of the first conductive layer, the second conductive layer, and the third conductive layer are: a silver conductive paste or a copper conductive paste.

Another preferable method of the present invention relates to a membrane circuit board with electrostatic discharge protection, including:

a first membrane layer, having a first surface and a second surface;

a second membrane layer, having a third surface and a fourth surface; and an electrostatic protection structure, including:

a first conductive layer, formed on a first surface of the first membrane layer;

a second conductive layer, formed between the second surface of the first membrane layer and the third surface of the second membrane layer; and a third conductive layer, formed on a fourth surface of the second membrane layer.

In the preferable embodiment, the membrane circuit board with electrostatic discharge protection further includes a spacer layer, the spacer layer is disposed between the first membrane layer and the second membrane layer, and an area of the spacer layer is smaller than that of the first membrane layer and the second membrane layer.

In the preferable embodiment, the membrane circuit board with electrostatic discharge protection further includes at least one opening, and the at least one opening passes through the first membrane layer and the second membrane layer.

In the preferable embodiment, the electrostatic protection structure is disposed at an inner edge of the at least one opening.

In the preferable embodiment, the electrostatic protection structure surrounds around the inner edge of the at least one opening. In the preferable embodiment, thicknesses of the first conductive layer, the second conductive layer, and the third conductive layer are in a range of 7 μm to 12 μm.

In the preferable embodiment, materials of the first membrane layer and the second membrane layer both are polyethylene terephthalate.

In the preferable embodiment, materials of the first conductive layer, the second conductive layer, and the third conductive layer are: a silver conductive paste or a copper conductive paste.

DETAILED DESCRIPTION OF THE PREFERRED EMBODIMENT

More detailed descriptions are made with reference to the examples of the embodiments and the accompanying drawings, to make advantages and features of the present invention and the method to implement the present invention easier to understand. However, the present invention may be implemented in different forms and it should not be understood that the present invention can be implemented only by using the embodiments described herein. On the contrary, for those ordinarily skilled in the art, the provided embodiments will make the disclosure more apparent and comprehensive and completely convey the scope of the present invention.

Figure 1:
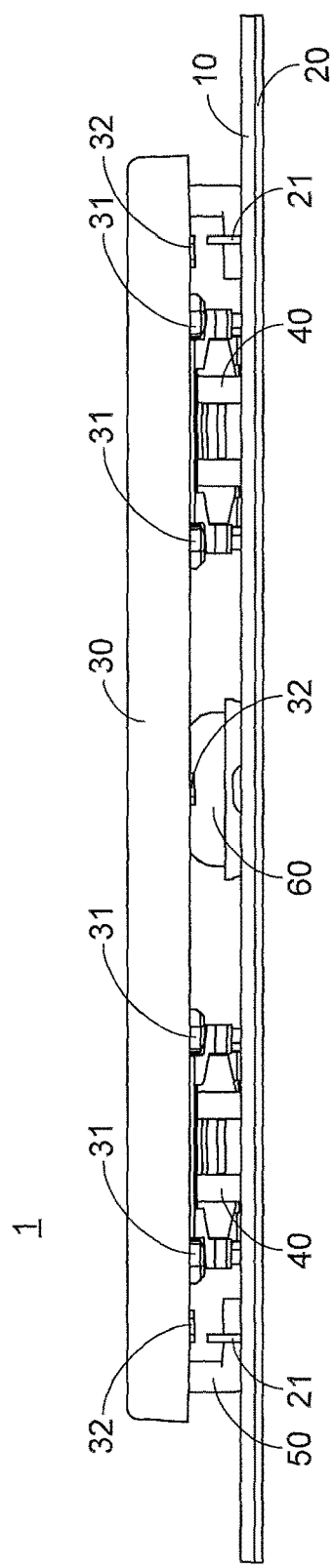
FIG. 1 is a side view of a key structure with electrostatic discharge protection of the present invention.
Figure 2:
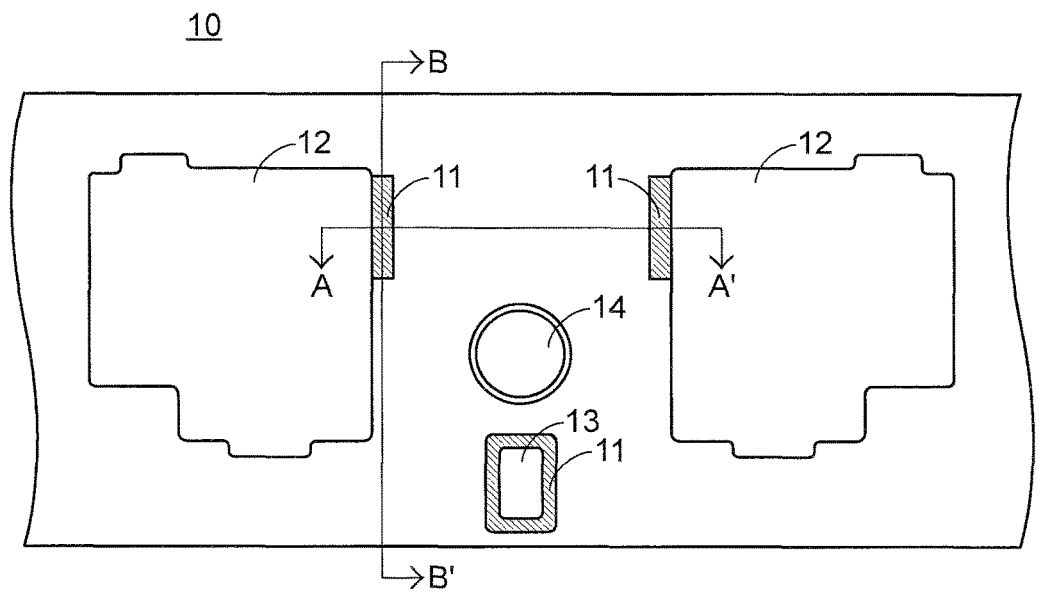
FIG. 2 is a top view of a membrane circuit board of the present invention.

First, referring to FIG. 1 and FIG. 2, FIG. 1 is a side view of a key structure with electrostatic discharge protection of the present invention, and FIG. 2 is a top view of a membrane circuit board of the present invention. In FIG. 1, a key structure 1 with electrostatic discharge protection of the present invention includes: a key cap 30, support elements 40, a balance lever 50, an elastic element 60, a membrane circuit board 10, and a metal support panel 20. The elastic element 60 is disposed below the key cap 30, and the two support elements 40 are of a scissors structure, disposed at two sides of the elastic element 30, and are configured to connect the key cap 30 and the metal support panel 20.

Still referring to FIG. 1, a lower surface of the key cap 30 is provided with a first bonding portion 31 and a second bonding portion 32. The membrane circuit board 10 is disposed on the metal support panel 20, and a third bonding portion 21 of the metal support panel 20 may pass through a first opening 12 of the membrane circuit board 10 (as shown in FIG. 2). During assembly of the key, one end of the support element 40 is pivotally connected to the first bonding portion 31 of the key cap 30, and the other end of the support element 40 is pivotally connected to the metal support panel 20 (not shown). In addition, one end of the balance lever 50 is pivotally connected to the second bonding portion 32 of the key cap 30, and the other end of the second bonding portion 32 is pivotally connected to the third bonding portion 21 of the metal support panel 20. In this way, the support element 40 can be rotatably connected between the key cap 30 and the metal support panel 20, so as to drive and guide the key cap 30 to lift up and down relative to the metal support panel 20. The balance lever 50 further enables the key cap 30 to stably move up and down, and not to incline or swing. Although present invention only provides the implementation that the support element 40 is a scissors structure, during actual application, the support element 40 may be replaced with other support elements having similar functions, for example, a connecting rod structure of a V shape or an A shape, or having two parallel connecting rods, and is not limited to the implementation provided in the present invention.

Still referring to FIG. 1 and FIG. 2, the elastic element 60 is disposed on the key switch 14 (as shown in FIG. 2). When the key cap 30 descends under pressing, the elastic element 60 deforms and contacts the key switch 14 by means of an elastic sheet (not shown) disposed in the elastic element 60, so as to generate a key signal. Moreover, when the key cap 30 is not pressed, the elastic element 60 may also provide an upward elastic restoring force to the key cap 30, so as to push the key cap 30 to ascend and reset. The elastic element 60 of the present invention may be: rubber or silica gel.

Referring to FIG. 2, the membrane circuit board 10 includes: a first opening 12, a second opening 13, a key switch 14, and an electrostatic protection structure 11. The first opening 12 is used to configure the support element 40 and the balance lever 50, and the second opening 13 is used to prevent the second bonding portion 32 of the lower surface of the key cap 30 from pressing the surface of the membrane circuit board 10 when the key cap 30 is pressed. The electrostatic protection structure 11 may be disposed at two opposite sides of the inner edges of two first openings 12 or may surround around the inner edge of the second opening 13. Although the present invention only provides the implementation in which the electrostatic protection structure 11 is disposed at two opposite sides of the inner edges or surrounds around the opening, during actual application, the electrostatic protection structure 11 may be disposed at any side of an inner edge of any opening on the membrane circuit board 10, and is not limited to the implementation provided in the present invention.

Figure 3:
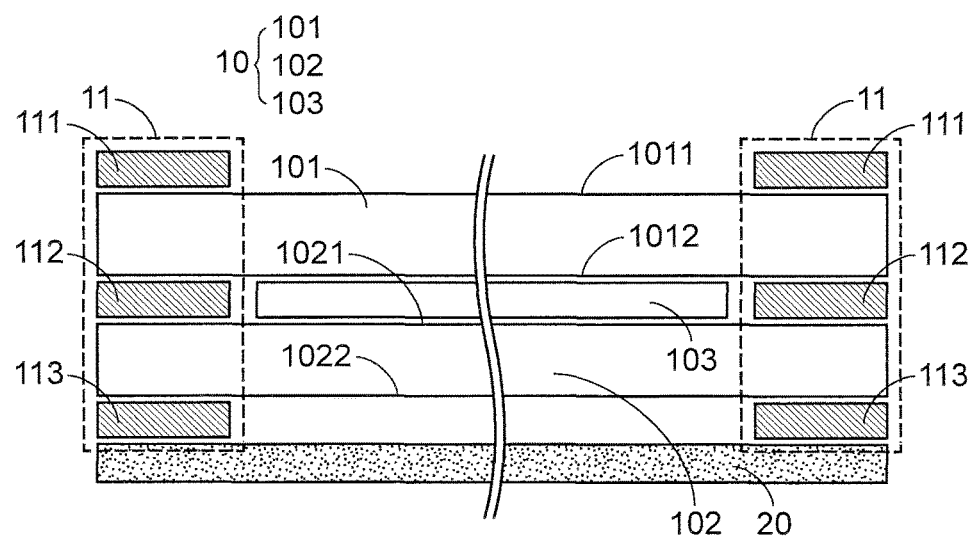
FIG. 3 is a schematic cross-sectional diagram of the membrane circuit board in FIG. 2 along line A-A'.
Figure 4:
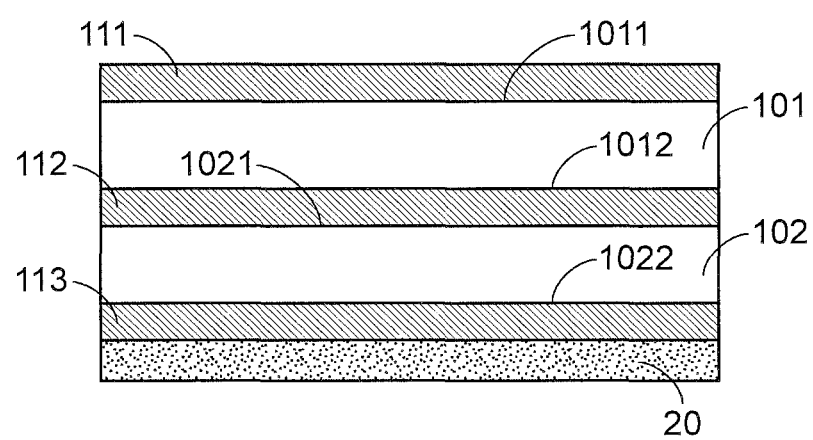
FIG. 4 is a schematic cross-sectional diagram of the membrane circuit board in FIG. 2 along line B-B'.

Referring to FIG. 3 and FIG. 4, FIG. 3 is a schematic cross-sectional diagram of the membrane circuit board in FIG. 2 along line A-A°, and FIG. 4 is a schematic cross-sectional diagram of the membrane circuit board in FIG. 2 along line B-B'. In FIG. 3 and FIG. 4, the membrane circuit board 10 disposed on the metal support panel 20 includes: a first membrane layer 101, a second membrane layer 102, and a spacer layer 103. The first membrane layer 101 has a first surface 1011 and a second surface 1012. The second membrane layer 102 has a third surface 1021 and a fourth surface 1022. The spacer layer 103 is disposed between the first membrane layer 101 and the second membrane layer 102, and an area of the spacer layer 103 is smaller than that of the first membrane layer 101 and the second membrane layer 102. Thicknesses of the first membrane layer 101 and the second membrane layer 102 both are 60 μm.

The electrostatic protection structure 11 includes: a first conductive layer 111, a second conductive layer 112, and a third conductive layer 113. The first conductive layer 111 is formed on the first surface 1011 of the first membrane layer 101. The second conductive layer 112 is formed on the second surface 1012 of the first membrane layer 101 and the third surface 1021 of the second membrane layer 102. The third conductive layer 113 is formed on the fourth surface 1022 of the second membrane layer 102, and thicknesses of the first conductive layer 111, the second conductive layer 112, and the third conductive layer 113 are all in a range of 7 μm to 12 μm. Materials of the first membrane layer 101 and the second membrane layer 102 both are polyethylene terephthalate (PET), and a conductive paste may be coated on the surface of the first membrane layer 101 and the second membrane layer 102 using a process of spraying or printing, so as to form the first conductive layer 111, the second conductive layer 112, and the third conductive layer 113. The conductive paste may be: a silver conductive paste or a copper conductive paste.

The area of the spacer layer 103 is smaller than that of the first membrane layer 101 and the second membrane layer 102, and therefore the second conductive layer 112 does not overlap with the spacer layer 103, so that the overall thickness of the membrane circuit board 10 can be reduced. In another aspect, a water-proof glue (not shown) may also be coated between the second conductive layer 112 and the spacer layer 103, so as to prevent moisture from penetrating into the membrane circuit board 10. Although the present invention only provides the implementation that the membrane circuit board 10 is of a three layer structure, and the spacer layer 103 is used as an insulation layer for isolating circuits (not shown) on the first membrane layer 101 and the second membrane layer 102, during actual application, the membrane circuit board 10 may also of a two layer structure and a colloid is coated between the first membrane layer 101 and the second membrane layer 102 for isolating the circuits, and is not limited to the implementation provided in the present invention.

Still referring to FIG. 3 and FIG. 4, when static electricity hits the electrostatic protection structure 11, a static current may sequentially pass through the first conductive layer 111, the first membrane layer 101, the second conductive layer 112, the second membrane layer 102, the third conductive layer 113, and the metal support panel 20, so as to conduct the static current to the ground. In another aspect, the electrostatic protection structure 11 can be disposed at the inner edge of the first opening 12 or the second opening 13 in the membrane circuit board 10 and the static current can flow according to the foregoing sequence (for example, when the static electricity hits the second conductive layer 112, the static current may sequentially pass through: the second conductive layer 112, the second membrane layer 102, the third conductive layer 113, and the metal support panel 20) when the static electricity hits the second conductive layer 112 or the third conductive layer 113 of the electrostatic protection structure 11 at the inner edge of the opening, so as to conduct the static current to ground, and therefore damage of circuits or electronic elements in the membrane circuit board 10 due to electric shock by static electricity can be effectively avoided.

As compared with the existing technology, the key structure with electrostatic discharge protection and the membrane circuit board thereof provided in the present invention can rapidly and effectively conduct static electricity to ground, and a grounding arm for conducting static current does not need to be additionally configured between the circuit board and the support panel. In this way, the complexity of manufacturing a key structure can be reduced, thereby improving the efficiency and yield of manufacturing of electronic products. In another aspect, the electrostatic protection structure does not overlap with the spacer layer of the membrane circuit board, and therefore the overall thickness of the membrane circuit board can be reduced. Thus, the present invention is a creation of extremely high industrial value.

Any modification made to the present invention by persons skilled in the art by means of technical measures shall fall within the protection scope of the present invention.

What is claimed is:

1. A membrane circuit board with electrostatic discharge protection, comprising:
    a first membrane layer, having a first surface and a second surface;
    a second membrane layer, having a third surface and a fourth surface; and
    an electrostatic protection structure, comprising:
    a first conductive layer, formed on a first surface of the first membrane layer;
    a second conductive layer, formed between the second surface of the first membrane layer and the third surface of the second membrane layer; and
    a third conductive layer, formed on the fourth surface of the second membrane layer.

2. The membrane circuit board with electrostatic discharge protection according to claim 1, wherein the membrane circuit board with electrostatic discharge protection further comprises a spacer layer, the spacer layer is disposed between the first membrane layer and the second membrane layer, and an area of the spacer layer is smaller than that of the first membrane layer and the second membrane layer.

3. The membrane circuit board with electrostatic discharge protection according to claim 1, wherein the membrane circuit board with electrostatic discharge protection further comprises at least one opening, and the at least one opening passes through the first membrane layer and the second membrane layer.

4. The membrane circuit board with electrostatic discharge protection according to claim 1, wherein thicknesses of the first conductive layer, the second conductive layer, and the third conductive layer are in a range of 7 μm to 12 μm.

5. The membrane circuit board with electrostatic discharge protection according to claim 1, wherein materials of the first membrane layer and the second membrane layer both are polyethylene terephthalate.

6. The membrane circuit board with electrostatic discharge protection according to claim 1, wherein materials of the first conductive layer, the second conductive layer, and the third conductive layer are: a silver conductive paste or a copper conductive paste.

7. The membrane circuit board with electrostatic discharge protection according to claim 3, wherein the electrostatic protection structure is disposed at an inner edge of the at least one opening.

8. The membrane circuit board with electrostatic discharge protection according to claim 7, wherein the electrostatic protection structure surrounds around an inner edge of the at least one opening.

9. A key structure with electrostatic discharge protection, comprising:
- a key cap;
- a metal support panel;
- a support element, connecting the key cap and the metal support panel and capable of guiding the key cap to move up and down relative to the metal support panel; and
- a membrane circuit board, disposed on the metal support panel, wherein the membrane circuit board comprises:
- a first membrane layer, having a first surface and a second surface;
- a second membrane layer, having a third surface and a fourth surface; and
- an electrostatic protection structure, comprising:
- a first conductive layer, formed on a first surface of the first membrane layer;
- a second conductive layer, formed between the second surface of the first membrane layer and the third surface of the second membrane layer; and
- a third conductive layer, formed on the fourth surface of the second membrane layer.

10. The key structure with electrostatic discharge protection according to claim 9, wherein the membrane circuit board further comprises a spacer layer, the spacer layer is disposed between the first membrane layer and the second membrane layer, and an area of the spacer layer is smaller than that of the first membrane layer and the second membrane layer.

11. The key structure with electrostatic discharge protection according to claim 9, wherein thicknesses of the first conductive layer, the second conductive layer, and the third conductive layer are in a range of 7 μm to 12 μm.

12. The key structure with electrostatic discharge protection according to claim 9, wherein materials of the first membrane layer and the second membrane layer both are polyethylene terephthalate.

13. The key structure with electrostatic discharge protection according to claim 9, wherein materials of the first conductive layer, the second conductive layer, and the third conductive layer are: a silver conductive paste or a copper conductive paste.

14. The key structure with electrostatic discharge protection according to claim 9, wherein the membrane circuit board comprises at least one opening, and the at least one opening passes through the first membrane layer and the second membrane layer.

15. The key structure with electrostatic discharge protection according to claim 14, wherein the electrostatic protection structure is disposed at an inner edge of the at least one opening.

16. The key structure with electrostatic discharge protection according to claim 15, wherein the electrostatic protection structure surrounds around the inner edge of the at least one opening.

* * * * *